United States Patent
Ogino et al.

(10) Patent No.: US 8,268,209 B2
(45) Date of Patent: Sep. 18, 2012

(54) PATTERN FORMING METHOD AND ITS MOLD

(75) Inventors: Masahiko Ogino, Hitachi (JP); Akihiro Miyauchi, Hitachi (JP); Takashi Ando, Hitachi (JP); Chiseki Haginoya, Tokyo (JP); Susumu Komoriya, Tokorozawa (JP); Yasunari Sohda, Kawasaki (JP); Souichi Katagiri, Kodaira (JP); Hiroya Ohta, Kokubunji (JP); Yoshinori Nakayama, Sayama (JP)

(73) Assignee: Hitachi, Ltd., Tokyo (JP)

( * ) Notice: Subject to any disclaimer, the term of this patent is extended or adjusted under 35 U.S.C. 154(b) by 393 days.

(21) Appl. No.: 11/623,776

(22) Filed: Jan. 17, 2007

(65) Prior Publication Data

US 2007/0164458 A1  Jul. 19, 2007

(30) Foreign Application Priority Data

Jan. 18, 2006  (JP) .................. 2006-009369

(51) Int. Cl.
*H01L 23/544* (2006.01)
(52) U.S. Cl. ........ 264/40.1; 257/797; 438/780; 977/887
(58) Field of Classification Search .................. 257/797; 438/780; 977/877; 264/40.1
See application file for complete search history.

(56) References Cited

U.S. PATENT DOCUMENTS

| | | | |
|---|---|---|---|
| 2003/0127007 A1* | 7/2003 | Sakurai et al. | 101/483 |
| 2003/0152018 A1* | 8/2003 | Medower et al. | 369/272 |
| 2004/0023162 A1* | 2/2004 | Hasegawa et al. | 430/320 |
| 2006/0061743 A1* | 3/2006 | Den Boef et al. | 355/53 |

FOREIGN PATENT DOCUMENTS

| | | |
|---|---|---|
| JP | 10-261246 | 9/1998 |
| JP | 2000-323461 | 11/2000 |
| JP | 2001-325725 | 11/2001 |
| JP | 2003-86537 | 3/2003 |
| JP | 2003-157520 | 5/2003 |
| JP | 2004-071587 | 3/2004 |
| JP | 2004-170935 | 6/2004 |
| JP | 2004-288783 | 10/2004 |
| JP | 2004-288804 | 10/2004 |
| JP | 2004-288845 | 10/2004 |
| JP | 2004-299153 | 10/2004 |
| JP | 2005-108822 | 4/2005 |
| JP | 2005-153091 | 6/2005 |
| JP | 2005-168494 | 6/2005 |
| JP | 2005-189128 | 7/2005 |

OTHER PUBLICATIONS

Office Action issued in Japanese Patent Application No. 2006-009369 on Nov. 30, 2010.

* cited by examiner

*Primary Examiner* — Khanh P Nguyen
*Assistant Examiner* — Margaret Squalls
(74) *Attorney, Agent, or Firm* — Antonelli, Terry, Stout & Kraus, LLP.

(57) ABSTRACT

In a mold in which a pattern is formed of a fine concavo-convex shape, two or more of alignment marks for determining a relative positional relation between a substrate and a mold are formed concentrically. Moreover, a damaged mark is identified from the positional information and shape of the respective marks, and an alignment between the mold and the substrate to which a resin film is applied is carried out excluding the damaged mark.

7 Claims, 8 Drawing Sheets

PATTERN FORMING METHOD AND ITS MOLD

BACKGROUND OF THE INVENTION

1. Field of the Invention

The present invention relates to a pattern forming method of transferring a fine concavo-convex pattern formed in a mold to a transferred substrate, and also relates to a mold using the same.

2. Description of the Related Art

In recent years, in integrated circuits the reduction in size and higher integration has been progressing, and as a pattern transfer technique for realizing this fine processing, higher precision of the photolithography apparatus has been pursued. However, the processing method is approaching the wavelength of a light source of light exposure and the lithography technology is also approaching the limit. For this reason, for pursuing further reduction in size and higher precision, an electron beam lithography apparatus which is a type of a charged particle beam apparatus is used in place of the lithography technology.

The pattern formation using an electron beam employs a method of drawing a mask pattern, unlike the one-shot exposure method in the pattern formation using a light source, such as an i line or an excimer laser. Therefore, the more patterns to draw, the more exposure (drawing) time it takes and the more pattern formation time it takes, which is a disadvantage. For this reason, as the integration level increases exponentially from 256 mega, to 1 giga, to 4 giga in memory capacity, the pattern formation time also increases exponentially, and thus a significant degradation in throughput is a concern. Then, for the purpose of speed up of the electron beam exposure apparatus, a collective pattern irradiation method has been under development where various shapes of masks are combined and these masks are irradiated with an electron beam to thereby form an electron beam of a complicated shape. As a result, while the reduction in pattern size is progressing, an increase in size and complexity of the electron beam lithography apparatus becomes essential, thus causing a disadvantage of increasing the apparatus cost.

On the other hand, as a technique for forming fine patterns at low cost, a nano imprint technique is known where a predetermined pattern is transferred by die-pressing a mold (metallic mold) having concavity and convexity of the same pattern as the pattern, the pattern being desired to be formed on a substrate, against a resin film layer formed in the surface of a transferred substrate. It is disclosed that the nano imprint technique allows a fine structure of 25 nm or less to be formed by transcription using a silicon wafer as a metallic mold.

In forming a fine pattern, such as an integrated circuit, a precise alignment needs to be carried out between a reticle having, for example, an original picture pattern (transcription pattern) formed thereon after precisely detecting the pattern position of a substrate which is placed on a stage. For the alignment accuracy, much higher alignment accuracy is needed due to reduction in pattern size associated with higher integration of semiconductor devices. For example, in order to form a pattern of a 32 nm node, a precise alignment with an error of 10 nm or less is required.

On the other hand, in the patterned media known as one of the next generation large capacity magnetic recording media, a fine concavo-convex pattern is formed in the recording surface of a disc substrate. In a commercially available ordinary disc substrate, a hole for fixing to a rotating drive part is formed in the center of the substrate, and the disc substrate rotates about the center of this hole, the center being as an axis. For this reason, concavo-convex patterns are arranged on circumferences concentric to the hole in the center of the substrate. If circular patterns of 10 nm in diameter are arranged so that the pitch interval (center to center distance between adjacent circular patterns) becomes 25 nm, then a recording medium with a recording density of 1 tera bit/square inch may be formed.

In JP-A-2003-157520, a nano imprint technique is used in forming a resist pattern for a magnetic recording media. In arranging fine concavo-convex patterns onto circumferences concentric to the rotation center of a disc substrate using the nano imprint technique, a relative alignment between a mold and the disc substrate becomes important. As the alignment means between the mold and the disc substrate, in JP-A-2003-157520, an alignment pattern is also formed along with a fine concavo-convex pattern onto a transferred substrate using a nano imprint technique, and subsequently, a rotation central axis is determined using the alignment pattern. In JP-A-10-261246, alignment is carried out by attaching to the center of a mold a projection of approximately the same diameter as the hole diameter in the center of the disc substrate, and fitting the disc substrate into the projection. JP-A-2001-325725 discloses a technique concerning the alignment of a perforated magnetic recording medium. In this method, an alignment mark is formed in the center of a master disc, and the alignment mark in the center of the master disc is shot by a CCD camera through a central opening of the disc substrate, and a relative alignment is carried out.

SUMMARY OF THE INVENTION

In an alignment between a substrate, in which an opening is formed in the center thereof like a disc substrate, and a mold, the following problems will occur. In the method of JP-A-2003-157520, a hole needs to be machined in the disc substrate after forming a concavo-convex pattern in the surface of the disc substrate. For this reason, the conventional disc substrate, in which a rotation central axis of the substrate is determined and a hole is machined at the time of purchasing, may not be used. Moreover, a hole, which is supposed to be machined before forming a recording layer, may be machined after forming the recording layer, and thus the manufacturing process needs to be changed significantly.

In the method of JP-A-10-261246, a high accuracy is needed in machining the projection. Moreover, the hole diameter of the center of the disc substrate also varies due to errors at the time of machining, and therefore, in carrying out alignment between the mold and the disc substrate only using the projection, the alignment accuracy will vary for each disc substrate to use and it is thus difficult to align accurately and repeatedly.

In the method of JP-A-2001-325725, because the master center and the central opening of the disc substrate are shot at the same time, the resolution is unlikely to be obtained, resulting in decrease in the alignment accuracy.

As described above, there is a problem that a precise alignment between the substrate, in which an opening is formed in the center like a disc substrate, and a mold is difficult.

Moreover, because in the conventional lithography apparatus, a reticle in which an original pattern picture is formed is transferred to a substrate in which a pattern is to be formed, optically or by drawing while being held in a non-contact manner, there is no alignment error factor associated with the contacting at the time of aligning. However, in the pattern formation using a nano imprint technique, a mold in which an original pattern picture is formed is contacted with and pressed against a substrate after applying a resin to the substrate surface to which a pattern is to be transferred, and thereafter heating or ultraviolet-ray irradiation needs to be carried out. As a result, because the contacting may not be avoided in principle, the alignment mark may be damaged due to the physical contact. The damage of the alignment mark causes an alignment failure of the whole pattern and causes more adverse effect than that concavity and convexity used for forming a transfer pattern is simply damaged.

The present invention is intended to provide a pattern forming method capable of carrying out a high precision alignment between a disc substrate in which a hole is formed in the center of the substrate, and a mold in forming a fine pattern structure using a nano imprint technique.

A first means to solve the above-described problems is a pattern forming method of pressing a mold, in which a fine concavo-convex pattern is formed, against a substrate and thereby transferring a fine concavo-convex pattern to the surface of the substrate, wherein the mold has two or more alignment marks for determining a relative positional relation between the substrate and the mold, on a concentric circle, and wherein an alignment between the mold and the substrate is carried out based on a relative positional relation between the alignment mark and an edge of a circular opening of the substrate.

A second means is a pattern forming method of pressing a mold, in which a pattern is formed of a fine concavo-convex shape, against a substrate and thereby transferring the fine concavo-convex pattern to the surface of the substrate, wherein the mold has a plurality of alignment marks for determining a relative positional relation between the substrate and the mold, the method further comprising a step of detecting whether or not an alignment mark has a damage at the time of determining the relative position, wherein if a damaged alignment mark is detected in the detection step, alignment is carried out using alignment marks except the damage portion.

In forming a fine pattern structure using a nano imprint technique, use of the present invention may provide a pattern forming method capable of carrying out a high precision alignment between a disc substrate, in which a hole is formed in the center of the substrate, and a mold regardless of whether or not an alignment mark at the time of contacting has a damage.

Other objects, features and advantages of the invention will become apparent from the following description of the embodiments of the invention taken in conjunction with the accompanying drawings.

DETAILED DESCRIPTION OF THE EMBODIMENTS

The mold used in the present invention has a fine concavo-convex pattern to be transferred, and the method of forming the concavo-convex pattern is not limited in particular. For example, photolithography, a focused ion beam lithography, an electron beam lithography, or the like is selected corresponding to a desired processing accuracy. For the material of the mold, silicon, quartz, glass, nickel, resin, or the like may be used, and the material just needs to have hardness and a required processing accuracy. Moreover, the one to whose surface a mold release processing is applied is preferable because it may suppress the deformation and damage of a transfer pattern at the time of peeling off.

The substrate used in the present invention is not limited in particular. For example, glass, metal such as silicon and an aluminum alloy, various materials of a resin substrate, such as epoxy and polyimide, and materials composed of these may be used. Moreover, a disc-shaped substrate having a circular opening in the center may be used. It is preferable that the circular opening in the center of the disc-shaped substrate is processed more accurately than the outer periphery of the disc substrate because this circular opening is used in alignment at the time of imprinting. The edge of the processed part may be chamfered in a tapered shape. Moreover, it is preferable that the disc substrate has an extremely high smoothness and has small waviness or the like. Moreover, a film made of material, such as a magnetic substance, different from that of the substrate may be formed in the surface.

Moreover, a resin film may be formed on the substrate to thereby transfer a pattern. In this case, the resin film is not limited in particular, however, the one providing a desired fine processing accuracy of the substrate surface is preferred. Not only thermoplastic resin and thermosetting resin but also photo-curing resin may be used. The suitable thermoplastic material includes the ones whose main ingredient is cycloolefin polymer, poly methyl methacrylate, polystyrene, polycarbonate, polyethylene terephthalate (PET), polylactic acid, polypropylene, polyethylene, polyvinyl alcohol, or the like. Moreover, the photo-curing material includes the ones of a radical polymerization system, a cationic polymerization system, or the like, but not limited thereto. It is preferable that the resin is liquid and has low viscosity at room temperature and is cured by irradiation of light, such as ultraviolet ray.

An alignment mark formed in a mold of the present invention is formed in the same surface as a pattern to be transferred or in the surface opposite to the pattern to be transferred. Other than this, the alignment mark may be formed in the surface different from the surface to be transferred. Moreover, it is preferable that the alignment mark is formed on a concentric circle. This allows a relative positional relation between the substrate and the mold to be recognized easily especially when aligning the relative position with respect to the circular opening in the center of the disc-shaped substrate. Moreover, it is preferable that the alignment mark of the present invention is formed in a symmetrical position relative to the center of the concentric circle. By forming an alignment mark in a symmetrical position, a relative position especially with respect to the circular opening in the center of the disc-shaped substrate is recognized at the same time, and an alignment in a direction that reduces a difference in the respective shift amounts allows for accurate alignment easily even if an alignment mark does not exist in the center position of the circular opening.

Moreover, it is preferable that a plurality sets of these alignment marks are formed on the mold. Forming a plurality of sets allows, even if a part of these alignment marks is contaminated with a transferred material or is physically damaged at the time of transferring, the other alignment marks to be used and allows the relative alignment between the substrate and the mold to be carried out. Similarly, it is preferable that the alignment mark of the present invention is formed in a plurality of different surfaces on the mold. Forming the alignment marks in the surface other than the transferred surface allows failures, such as contamination and missing, to be prevented.

The alignment mark of the present invention is not limited to a step-shaped mark, and may be the one formed of material different from that of the mold, and the alignment mark is not limited in particular as long as it is the one capable of providing a higher intensity mark detection signal. Specifically, Cr or the like may be used. Moreover, in case of the step-shaped mark, the depth of the transfer pattern may be different from the depth of the alignment mark. In this case, it is especially preferable that the depth of the alignment mark satisfies a relationship of $t(n-1)=\lambda/2\,(1+a)$ (n: refractive index of the mold, t: pattern depth, $\lambda$: wavelength of the irradiation light) because a higher detection signal intensity may be obtained. Moreover, it is preferable that the alignment mark of the present invention is arc-shaped. By making arc-shaped, the shape with respect to the edge of the circular opening becomes analogous when aligning with the circular opening in the center of the disc-shaped substrate, thereby allowing the alignment mark to be recognized with high accuracy. The ones with the central angle $\theta$ of the arc being in the range of $0°<\theta<=360°$ may be used.

Moreover, it is preferable that the radius of the concentric circle on which the alignment mark of the present invention is formed is smaller than the radius of the circular opening of the substrate. By making the radius of the concentric circle smaller than the radius of the opening in the center of the substrate, a risk with respect to contamination of the alignment mark due to the resin at the time of transferring will decrease and the visibility to the edge of the circular opening in the center of the disc will improve.

Moreover, the detecting method of a damaged alignment mark of the present invention is carried out using a method of detecting by referring to information on the relative position and absolute position in which alignment marks are formed, and a method of detecting by referring to the pattern shape. Moreover, the detection may be made using a combination of these methods.

The pattern transferring apparatus of the present invention for transferring a fine concavo-convex pattern to a substrate surface, comprises a substrate holding part for holding the substrate, a mold fixing part for fixing a mold, and an alignment monitoring part for recognizing a relative positional relation between the substrate and the mold. It is preferable that the substrate holding part comprises a driving unit capable of moving the substrate in the X, Y, Z, and $\theta$ direction at the time of alignment. It is preferable that the mold fixing part also comprises a driving unit which moves a metallic mold in the X, Y, and Z direction. Moreover, in these driving units, it is preferable in terms of carrying out a high precision alignment that a drive system using a piezo-electric element allowing for finer movement, and a drive system combining these are used in addition to a stepping motor. Moreover, a damaged alignment mark may be detected by combining these driving units with the function of the alignment monitoring part. The alignment monitoring part comprises a pattern recognition unit and the like in addition to optical systems, such as a light source, a microscope, and a CCD, for recognizing the alignment pattern. As the light source, a laser may be used, or a single wavelength and a plurality of separated wavelengths may be also used. Moreover, it is preferable in terms of forming a favorable transfer pattern that the pattern transferring apparatus has a mechanism for heating and cooling the substrate and the function to deliver light to the transferred surface.

Embodiment 1

Figure 1:
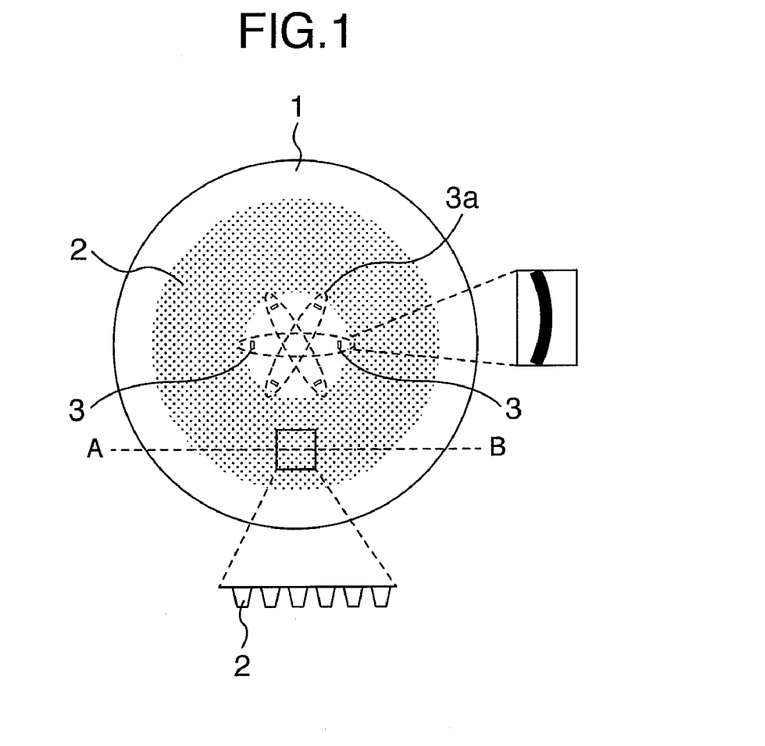
FIG. 1 is a top view of a mold.

FIG. 1 shows a top view of a mold 1 used in this embodiment. The mold 1 is made of a quartz substrate and is a disc with 1000 μm in thickness and 100 mm in diameter. A fine concavo-convex pattern 2 of 100 nm or less may be easily processed on the surface of the mold 1 using a well-known electron beam drawing technique.

The fine concavo-convex pattern 2 formed in the surface of the mold 1 is arranged on circumferences concentric to the center opening of the disc substrate. This concavo-convex pattern 2 is prepared as follows: first, a resist pattern is formed patterning a resist layer formed on the substrate by means of the electron beam drawing technique, and then, concave portions are formed on the mold 1 using the resist pattern as a mask by means of a well-known dry etching technique. The concavo-convex pattern 2 prepared here has a via structure having the cross section with 35 nm in diameter at the concave upper surface, 20 nm in diameter at the concave bottom surface, and 100 nm in depth, and this is arranged at intervals of 40 nm from pattern center to pattern center.

Three sets of arc-shaped alignment marks with 20 μm in width, 100 μm in length, and 650 nm in depth are formed at positions of point symmetry about a virtual center on a concentric circle with a radius of 9.99 mm having the same center as the center of a pattern formation region.

For the disc substrate to serve as a transferred substrate, a glass substrate manufactured and sold for recording media, the glass substrate being processed into 0.8 mm in thickness, 65 mm in diameter of the outer circle, and 20 mm in diameter of the center opening, is used.

Figure 2:
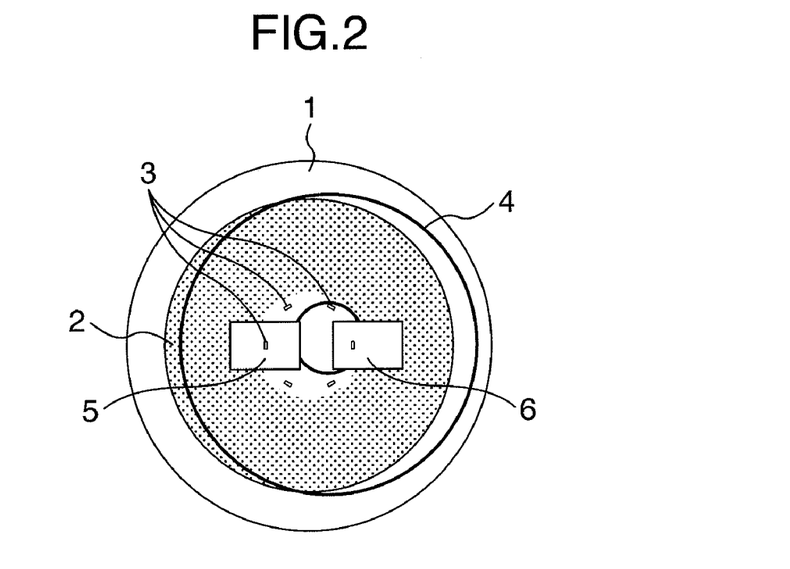
FIG. 2 is a top view when the mold is pressed against a disc substrate.

As shown in FIG. 2, when a resist pattern is formed by pressing the mold 1, in which the fine concavo-convex pattern 2 is formed, against a resin film 8 which is applied to the recording surface of a disc substrate 4, a relative position between the disc substrate 4 and the mold 1 needs to be aligned with sufficient accuracy so that the concavo-convex pattern of the mold 1 may be concentric to the center opening of the disc substrate. Then, the forming method of an alignment mark and the aligning method between the disc substrate and the mold carried out in the present invention will be described hereinafter.

In the surface of the mold 1, along with the concavo-convex pattern 2, an alignment mark 3 formed of three sets of arc lines is formed on a circle concentric to the center opening of the disc substrate 4, at positions corresponding to the vicinity of the inner circumference of the circular opening in the center of the disc substrate. In this embodiment, the alignment mark 3 is prepared on a circumference with 19.98 mm in diameter because the inner diameter of the disc substrate is provided with a processing accuracy in the range from 20.000 mm to 20.02 mm. The depth of the alignment mark 3 is set to 656 nm by considering that the wavelength of the alignment light is 656.28 nm. Moreover, the width of the alignment mark is set to 20 μm. The alignment mark 3 is formed on the mold 1 using the well-known photolithography process and dry etching technique before forming the concavo-convex pattern 2.

Before carrying out a relative alignment between the substrate and the mold, a presence check of a damaged alignment mark is carried out based on the information on the position in which the alignment mark is formed.

Figure 3:
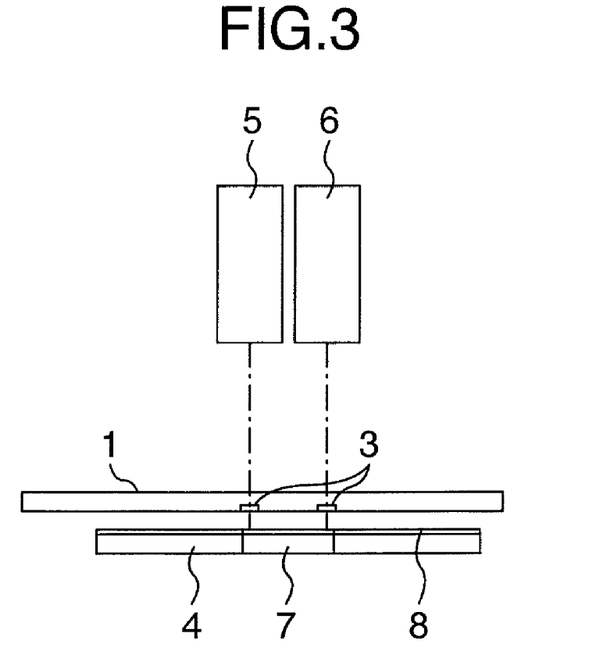
FIG. 3 is a schematic view of alignment between the mold and the disc substrate using an alignment mark.

Next, a relative alignment between the substrate and the mold is carried out by the following method. FIG. 3 shows a schematic diagram at the time of carrying out alignment between the mold 1 and the disc substrate 4 using the alignment mark 3. FIG. 3 shows a state viewed from the side.

A center opening 7 is provided in the disc substrate 4, and a photo-curing resin film 8 with the film thickness of 100 nm is applied to the recording surface using a spin coat method. A photo-curing resin of a radical polymerization system with viscosity of 4 cP is applied to the resist material. The resist coated surface of the disc substrate 4 is set so as to face the surface of the mold 1 in which the concavo-convex pattern 2 and the alignment mark 3 are processed. Then, the disc substrate 4 is held on an movable stage and the mold 1 is held to the mold fixing part.

Above the disc substrate 4, two cameras 5 and 6 are set so that the edge of an inner circumference of the disc substrate 4 and the alignment mark 3 on the mold 1 may be observed at the same time. With the use of images observed by the cameras 5 and 6, first, one set of marks which are not damaged are selected from a plurality of alignment marks 3 while moving the disc substrate 4 coarsely, and this mark is the reference. Next, the position of the disc substrate 4 is finely adjusted so that the relative position between a datum line and the edge of the disc substrate observed by the camera 5 and the relative position between the datum line and the edge of the disc substrate observed by the camera 6 become equal.

With the alignment using the alignment mark 3, the concavo-convex pattern 2 of the mold 1 is relatively aligned with the disc substrate 4 while suppressing the amount of eccentricity to 10 μm or less.

After finishing the alignment, the resin film 8 is contacted with and pressed against the mold 1 while maintaining the relative position between the disc substrate 4 and the mold 1. Next, the resin is irradiated with a light of 365 nm with an energy of 5 J/cm$^2$ using an exposure apparatus having a non-illustrated ultra high pressure mercury lamp and the resin is thus cured. Next, the mold 1 is peeled off from the disc substrate 4. Accordingly, in the resin film 8, a resist pattern is prepared in which a columnar structure having the cross section with 35 nm in diameter at the convex bottom part, 25 nm in diameter at the convex upper surface part, and 100 nm in height, is arranged at intervals of 40 nm from pattern center to pattern center.

Figure 4:
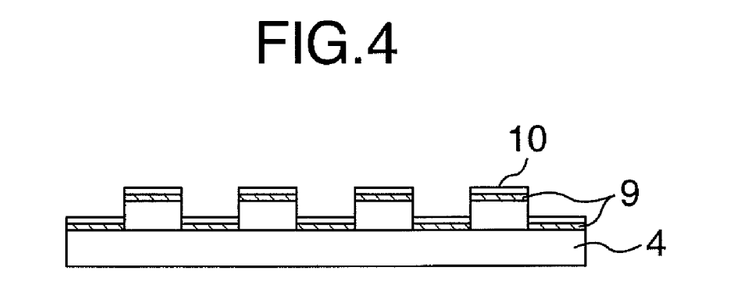
FIG. 4 is a cross sectional view of a magnetic recording medium.

This resist pattern is used as a mask in the manufacturing process using dry etching. After finishing the manufacturing process using dry etching, on the disc substrate is formed a fine concavo-convex pattern in which a columnar structure having the cross section with 30 nm in diameter at the convex bottom part, 20 nm in diameter at the convex upper surface part, and 20 nm in height is arranged at intervals of 40 nm from pattern center to pattern center. Next, as shown in FIG. 4, on the disc substrate in which this concavo-convex pattern is formed, a magnetic layer 9 with approximately 50 nm in thickness is formed using a sputtering technique and, thereafter a protective film 10 and a lubricous film are formed so as to cover this magnetic layer. Thus, a magnetic recording medium whose recording density is approximately 300 giga bits//square inch, wherein a magnetic layer on a convex portion operates as a recording bit, may be prepared.

In this embodiment, the concavo-convex pattern 2 formed in the surface of the mold 1 has a structure with draft taper having a pillar-shaped cross section, however, a structure with draft taper having a rectangular cross section, or a structure with taper whose groove is processed into a truck shape may be employed. Moreover, although the relative position between the alignment mark and the edge of the disc substrate is observed at two places using two alignment marks and two cameras, three alignment marks and three or more cameras may be set to align at three or more places.

In the alignment between the mold and the disc substrate, a projection with a diameter smaller than the diameter of the center opening of the disc substrate in the center of the mold is attached and the projection attached to the center of the mold is passed through the center opening of the disc substrate to thereby coarsely determine the relative position between the disc substrate and the mold, and thereafter the position is adjusted using the alignment mark, thereby allowing an accurate alignment to be carried out easily in a short time and allowing the accuracy to be increased.

Although in this embodiment the alignment was carried out using the center opening, a high precision alignment may be also carried out using the center opening of this embodiment after carrying out a simple alignment in the outer circumference of the substrate. Moreover, in the case where a high precision alignment is not required, only simple alignment between the outer circumference of the substrate and the mold may be also carried out.

In addition, although in this embodiment a case of manufacturing a magnetic recording medium was described, the present invention may be also applied to the manufacturing of optical recording medium.

Embodiment 2

A mold is prepared using the same method as that of Embodiment 1. In the concavo-convex pattern prepared here, a columnar structure having the cross section with 35 nm in diameter at the bottom surface, 20 nm in diameter at the upper surface, and 100 nm in depth, is arranged at intervals of 40 nm from pattern center to pattern center. Moreover, an alignment mark similar to that of Embodiment 1 is also formed.

For the disc substrate, a glass substrate manufactured and sold for recording media, the glass substrate being processed into 0.8 mm in thickness, 65 mm in diameter of the outer circle, and 20 mm in diameter of the center opening, is used.

The aligning method between the mold and the disc substrate, and a subsequent method of transferring a concavo-convex pattern to a resist layer which is applied to a recording surface of the disc substrate are carried out using the methods similar to those of Embodiment 1. With these methods, in the resin film is prepared a resist pattern in which a hole having the cross section with 25 nm in diameter at the concave bottom part, 35 nm in diameter at the concave upper surface part, and 100 nm in depth, is arranged at intervals of 40 nm from pattern center to pattern center.

Figure 5A:
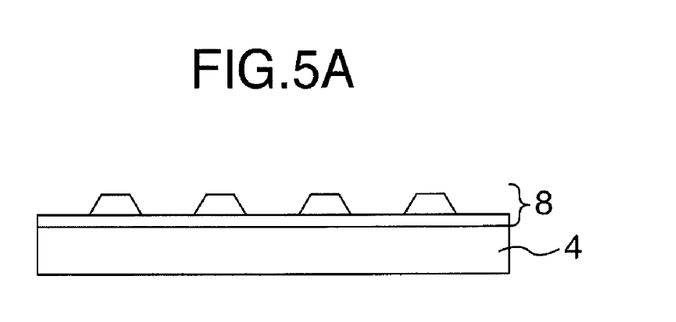
FIG. 5A to 5D are views showing the process of forming a recording layer of a disc substrate to which a concavo-convex pattern is transferred.

FIG. 5A to 5D show the manufacturing steps from a state where a concavo-convex pattern is already transferred to the resin film 8 which is applied to the recording surface of the disc substrate 4 until forming a magnetic layer in the recording surface of the disc substrate as a recording layer. In the state where the concavo-convex pattern formed in the mold is already transferred to the resin film 8 which is applied to the disc substrate 4, a resist base layer of 10 nm in thickness remains in the concave bottom of the resin film 8 (FIG. 5A).

Figure 5B:
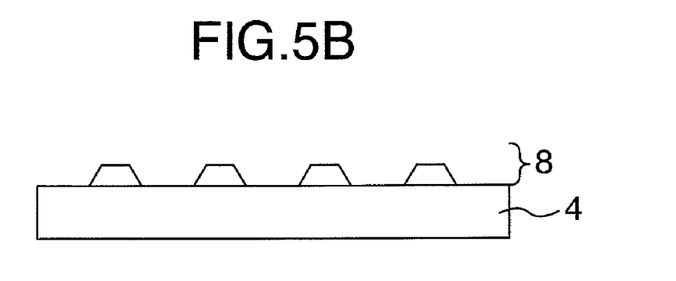
Figure 5C:
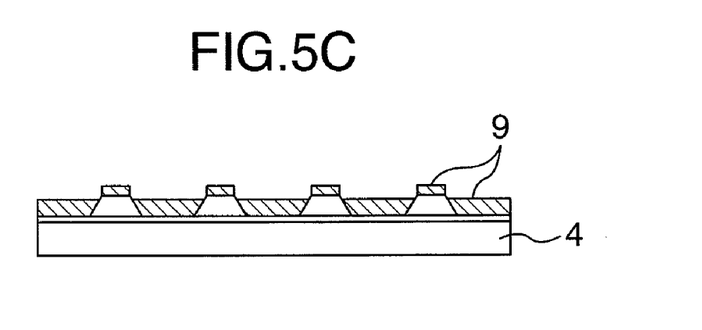
Figure 5D:
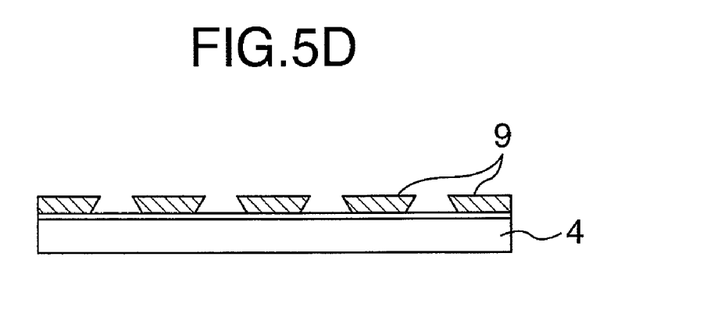

If only the resist base layer is removed from this state using dry etching, then a recording surface of the disc substrate emerges in the concave bottom (FIG. 5B). In this state, a magnetic layer 9 of 50 nm in thickness is formed on the resist pattern as well as on the surface of the disc substrate using a sputtering technique (FIG. 5C). Then, the remaining resin film and the magnetic layer formed on the resin film are removed by a lift-off technique (FIG. 5D).

With the above methods, on the recording surface of the disc substrate 4 is formed a fine concavo-convex pattern in which a magnetic layer of a columnar structure having the cross section with 20 nm in diameter at the bottom part, 25 nm in diameter at the upper part, and 50 nm in height is arranged at intervals of 40 nm from pattern center to pattern center. A protective film and a lubricating film are formed so as to cover the magnetic layer and the surface of the disc substrate, thereby preparing a magnetic recording medium whose recording density is approximately 300 giga bits//square inch, wherein a convex portion on the disc substrate operates as a recording bit.

Embodiment 3

Figure 6:
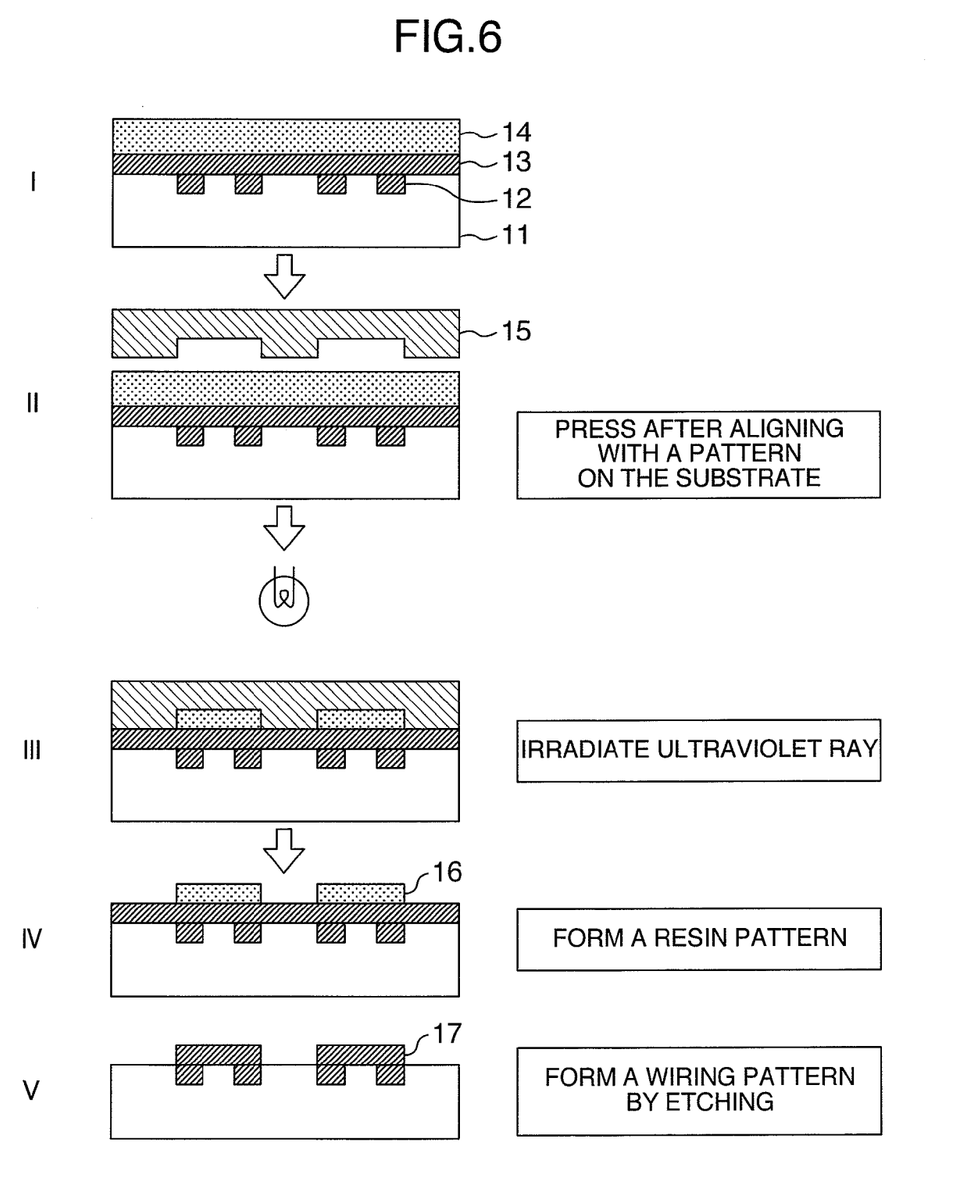
FIG. 6 is a view showing a pattern forming procedure by nano imprint onto a silicon wafer.

Next, a pattern forming procedure by nano imprint onto a silicon wafer is described using FIG. 6, which is a view schematically explaining a wiring pattern forming method in the case where a photo-curing type resin is used. A wiring pattern 12 is formed in a wafer 11. On this surface, an upper wiring layer 13 is deposited and a photo-curing type resin 14 is further applied (I). Next, a mold 15 in which a pattern is formed is brought closer to the wafer 11 from above the wafer 11, and after carrying out alignment between the mold 15 and the wafer 11 before contacting to each other, the both are relatively pressed to thereby form a pattern (II). The mold 15 is made of quartz and allows passage of light. By irradiating an ultraviolet ray from the back side of the mold 15 after pressing the mold 15, the concavo-convex pattern 2 of the resin film is cured (III). Removal of the mold 15 and removal of a base layer remaining at the bottom of the concavo pattern will form a resin pattern 16 (IV). If a wiring layer in the underlayer is etched using this resin pattern 16 as a mask, a wiring pattern 17 is formed (V).

Figure 7:
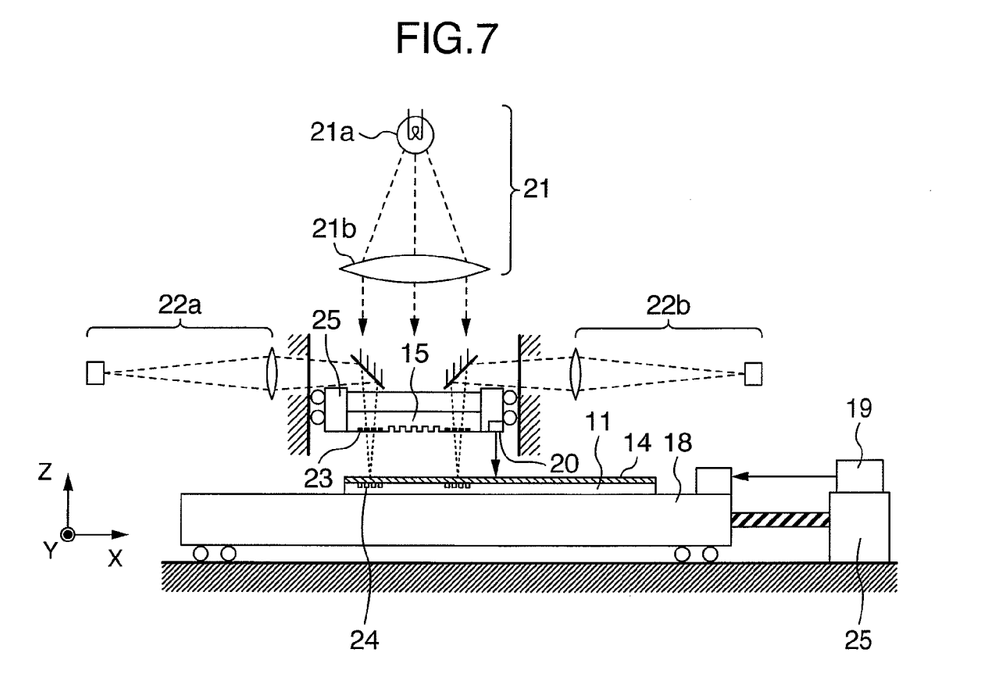
FIG. 7 is a view showing a nano imprint apparatus.

Next, the outline of the nano imprint apparatus is described using FIG. 7. Resin is applied to the surface of the wafer 11 to which a pattern is to be transferred, and the wafer is held on a stage 18. This stage 18 is provided with a mechanism capable of aligning in the direction (Y) perpendicular to the space sheet, and in the rotational direction (YAW) within the XY plane in addition to in one axis direction (X) of the view. The position of the stage 18 is measured by a laser length measuring machine 19, and the stage 18 is moved to a predetermined position by a stage drive unit 26.

Moreover, above the stage 18 is set a metallic mold stage 25 carrying the mold 15 in which mold a pattern to be transferred to the wafer 11 is formed. The metallic mold stage 25 is capable of aligning in the vertical direction (Z), and comprises a Z sensor 20 capable of measuring a distance to the wafer substrate, and a load sensor (not shown) capable of measuring a load after contacting to the wafer substrate 1. As the Z sensor 20, a laser length measuring machine, an electrostatic capacity type gap sensor, or the like may be used. Moreover, providing the Z sensor in a plurality of positions of the metallic mold stage allows the metallic mold to be pressed against the substrate while securing parallelism between the metallic mold and the substrate.

The mold 15 is made of a transparent substrate, for example, quartz or glass, and allows passage of light. Moreover, the sizes of the wafer 11 and mold 15 may be the same, or the size of the mold 15 may be a fraction of the size of the wafer 11. In case of a faction thereof, a pattern will be formed across the whole wafer by transferring the pattern while stepping like the conventional stepper apparatus.

A mercury lamp 21a is prepared further above, and an illumination light, which followed an optical path shown by a dashed line, transmitted an illumination optical system 21b, and is converted into parallel light, will transmit the mold 15 and illuminate the photo-curing type resin film. This illumination is capable of controlling the exposure amount and exposure time by a non-illustrated shutter.

Above the stage 18, there are prepared position sensors 22a and 22b which detect the position of the pattern formation surface of the metallic mold and the position of the wafer. Just before the metallic mold descends and contacts with the wafer 11, for example, in a region from a halting position 10 µm thereabove to a position contacting thereto, the position of a metallic mold alignment mark 23 which is formed in the surface of the mold 15 in advance, and the position of an alignment mark 24 on the wafer may be measured using the position sensors 22a and 22b. This allows for alignment of the relative position between the wafer and the metallic mold. Furthermore, these position sensors 22a and 22b are fixed to a reference position of the apparatus and measure the absolute position of the reference of the metallic mold apparatus. Moreover, the wafer 11, which is a sample, is not limited to a Si substrate, but may be a GaAs substrate, a glass substrate, or a plastic substrate.

Figure 8:
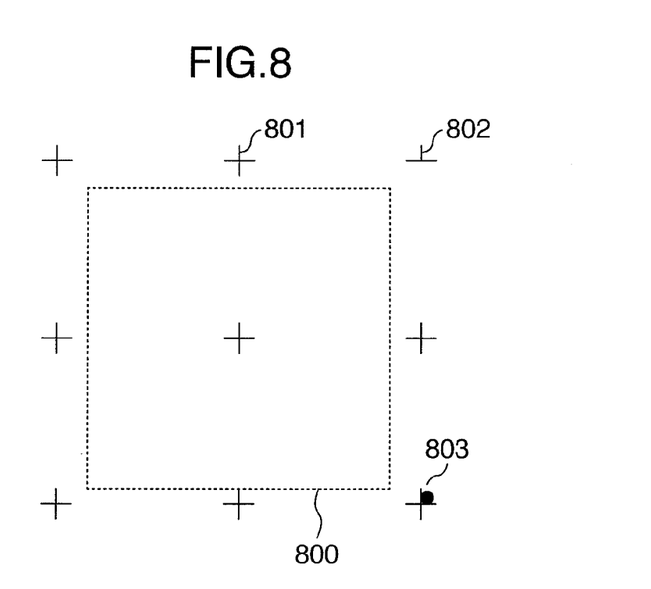
FIG. 8 is a view showing an arrangement of alignment marks of a metallic mold.

FIG. 8 shows an arrangement of an alignment mark 801 of the metallic mold used in this embodiment. The alignment mark is a block of concavo-convex patterns and has a shape of a line and space pattern or a cross shape. In FIG. 8, an alignment mark by a cross of 2 µm in length is positioned in the outer circumference of a certain region having a transfer pattern and is arranged at eight symmetrical positions. Because the alignment mark is formed on the same surface as the transfer pattern in the same manufacturing step and is pressed against the wafer at the time of pattern transferring, a damage associated with the mechanical contact may occur. For example, the damage includes a missing of the mark and an adhesion of the resin. If the alignment mark is damaged, the alignment accuracy will decrease and have a serious influence on the yield. In this embodiment, two out of the measurement results of the positions of eight marks shift from the design value by 500 nm or more, and are considered as been damaged. On the other hand, the rest six marks remain within a range from 30 nm to 50 nm in shift. As a result of the alignment except for the missing and resin-adhered alignment marks 802 and 803, an accurate transfer was able to be carried out. The alignment accuracy has been improved from 300 nm to 70 nm.

Moreover, the wafer alignment mark 24 of FIG. 7 may be a periodic pattern. This is because higher precision position detection is carried out by detecting the primary diffraction light using the detector. Because in this method an influence on a position detection error decreases even if one line of the periodic pattern is damaged, it is difficult to identify a damaged mark. Then, separately providing an optical means capable of observing the image of a mark using zero-order light would resolve this problem. A damaged mark may be selected by comparing an image signal of each mark with an image signal obtained from a non-damaged mark. This allows a high precision position detection and an identification of a damaged mark to be combined.

Embodiment 4

Figure 9A:
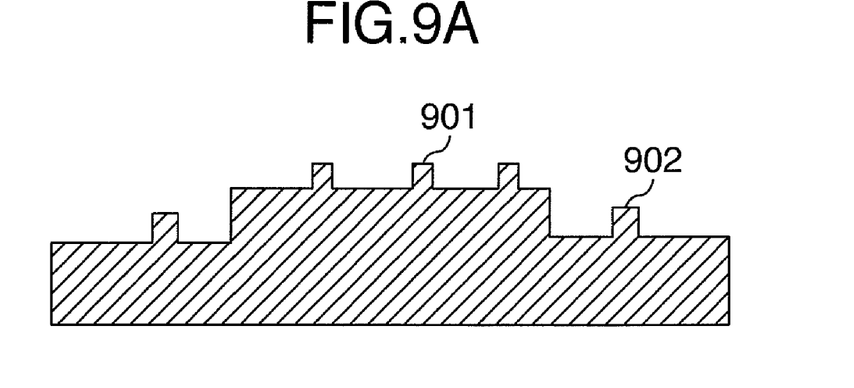
FIG. 9A is a cross sectional view of a metallic mold.
Figure 9B:
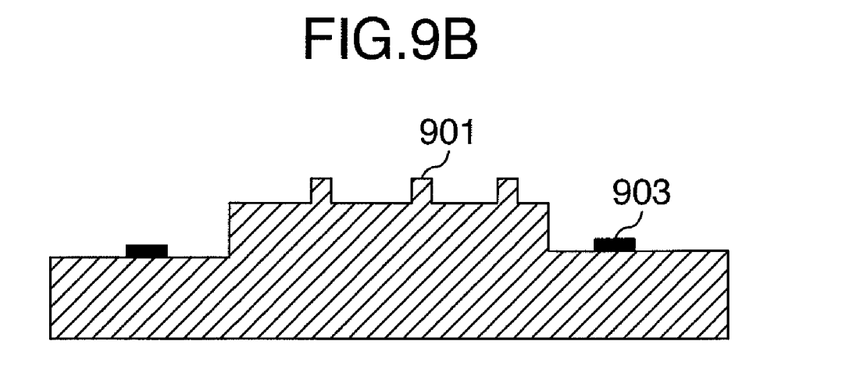
FIG. 9B is a cross sectional view of a metallic mold.
Figure 9C:
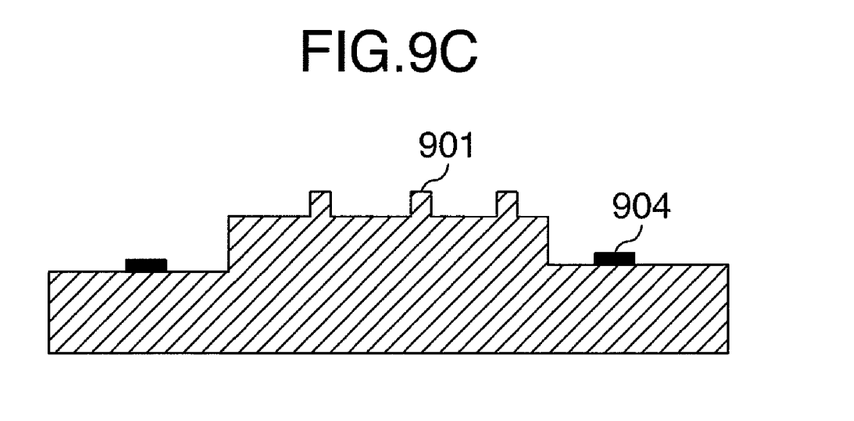
FIG. 9C is a cross sectional view of a metallic mold.

In this embodiment, metallic molds having cross section structures of FIGS. 9A, 9B, and 9C are used in order to further reduce an influence from damages. The arrangement of an alignment mark is the same as that of FIG. 8. As apparent from FIGS. 9A, 9B, and 9C, in this embodiment, the alignment mark is formed in a deeper position than the transfer pattern (a position away from the sample at the time of transferring). Accordingly, the alignment mark will not contact with the sample at the time of transferring, and there is thus no possibility of occurrence of a damage. This allows a high yield to be maintained even in a continuous use. As the alignment mark, a concavo-convex alignment pattern 902 is prepared. Use of this metallic mold allowed 90% or more yield in 1000 times use to be maintained, and an excellent result was obtained. In these metallic molds, a portion in the direction of the outer circumference of the substrate is etched once to prepare a step and thereby form planes with different heights, and then the alignment mark is formed in a lower plane and the transfer pattern is formed in a higher plane, thereby preparing the metallic mold.

Figure 10A:
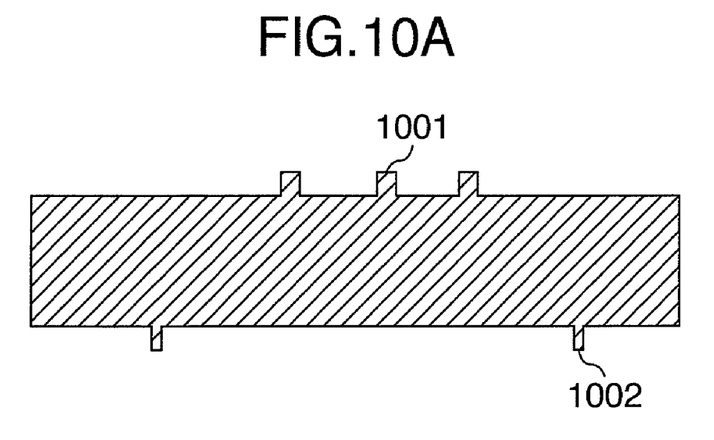
FIG. 10A is a cross sectional view of a metallic mold.
Figure 10B:
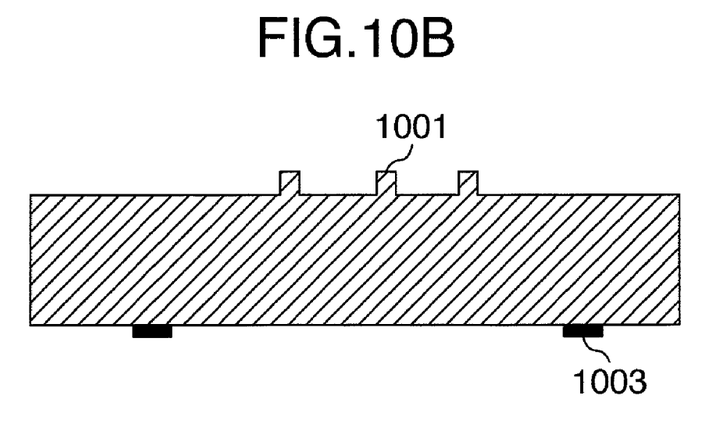
FIG. 10B is a cross sectional view of a metallic mold.
Figure 10C:
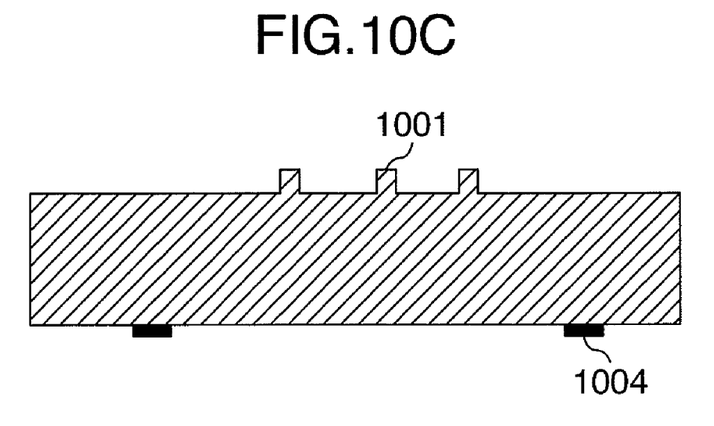
FIG. 10C is a cross sectional view of a metallic mold.

Other than this, metallic molds with small possibility of a mark being damaged include the ones having a metal film pattern 903 or a fluorescent pattern 904 provided therein. The concavo-convex pattern allows for commonality of the process used in the formation of the transfer pattern, which is advantageous in light of the manufacturing process. However, in order to obtain higher contrast in detecting the mark by light, it is effective to use a mark of a structure different from the transfer pattern, such as a metal film pattern having high reflectivity or a fluorescent pattern which itself emits fluorescence. Moreover, in FIGS. 10A, 10B, and 10C, alignment marks, such as a rear face concavo-convex pattern 1002, a rear face metal film pattern 1003, and a rear face fluorescent pattern 1004, are formed in the surface of the opposite side of a transfer pattern 1001. Because the alignment mark exists in the opposite side of the surface which is pressed against the sample, the possibility of the mark being damaged will decrease.

Figure 11A:
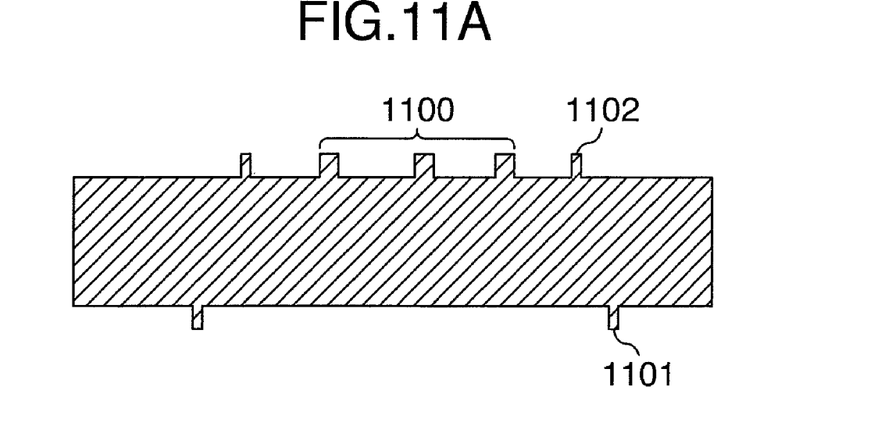
FIG. 11A is a cross sectional view of a metallic mold.
Figure 11B:
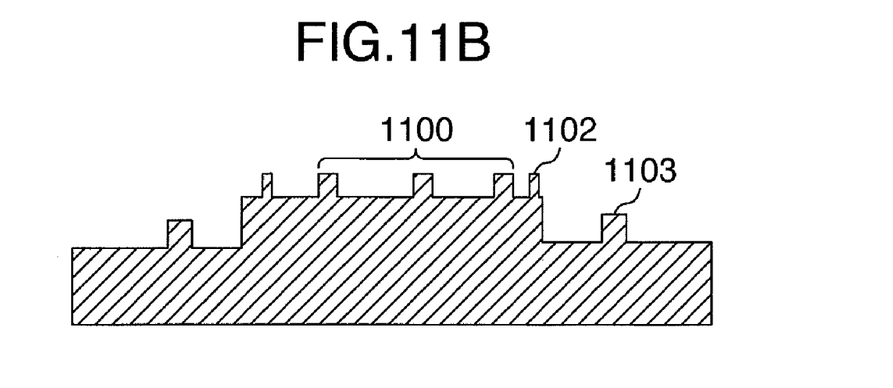
FIG. 11B is a cross sectional view of a metallic mold.
Figure 11C:
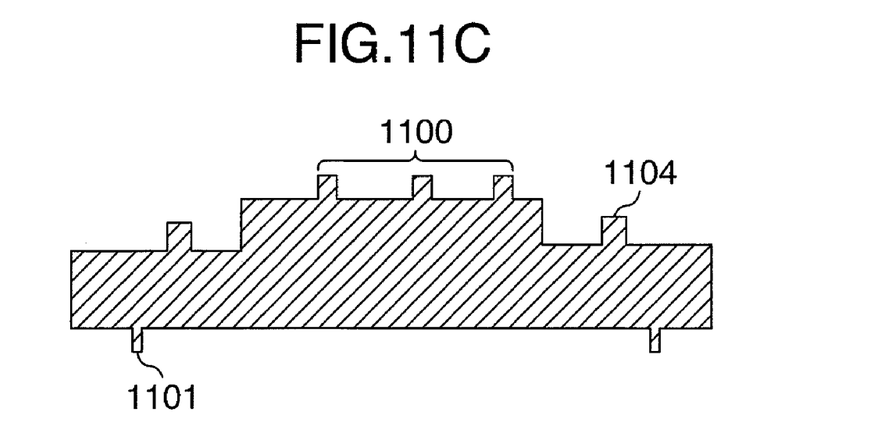
FIG. 11C is a cross sectional view of a metallic mold.

However, in these methods, a relative position error between the transfer pattern and the alignment mark is likely to increase. Then, as an idea of coping with this, an example in the case where an alignment mark is provided both in the transfer pattern surface and in the other surface is shown in FIGS. 11A, 11B, and 11C. For example, if a first alignment mark 1101 is provided in the surface different from a transfer pattern 1100 as shown in FIG. 11A, the alignment mark may not be formed at the same time with the transfer pattern, and therefore, a relative position error between the alignment mark 1101 and the transfer pattern 1100 is likely to increase. Accordingly, it is effective to provide a second alignment mark 1102 also in the same surface as the transfer pattern. That is, the position of a pattern which has been transferred by detecting the position of the first alignment mark 1101 is calibrated using a transfer result of the second alignment mark 1102 in the same surface as the transfer pattern. If a relationship between the both marks is measured once in advance, even a damage of the alignment mark in the transfer pattern surface would not cause a serious problem. In addition, the position detection mark formed in the surface different from the transfer pattern surface is not limited to a step-shaped mark like this embodiment, but it may be the one made of material different from that of the substrate, and thus a higher intensity mark detection signal may be obtained. Moreover, as shown in FIGS. 11B and 11C, it is similarly effective to make the mold to be step-shaped and form an alignment mark in the deeper surface having lower height relative to the projecting transfer pattern surface.

Although the above four embodiments used a photo-curing type resin, a thermosetting type resin may also obtain a similar effect.

As described above, in a mold in which a pattern is formed of a fine concavo-convex shape, a plurality sets of alignment marks for determining a relative positional relation between a substrate and a mold are formed in a concentrically symmetrical position at two or more places, and a damaged mark is identified from the positional information and shapes of the respective marks, and alignment between the mold and the substrate to which a resin film is applied is carried out excluding the damaged mark, and thereby a high precision alignment may be carried out without damaging the alignment mark at the time of contacting even in a disc substrate in which a hole is formed in the center of the substrate.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pattern forming method of pressing a mold, in which a concavo-convex pattern is formed, against a substrate to which a resin film is applied, and thereby transferring this concavo-convex pattern to a surface of the substrate, wherein the mold has two or more alignment marks for determining a relative positional relation between the substrate and the mold, on a concentric circle, wherein alignment between the mold and the substrate is carried out from the relative positional relation between the alignment mark and an edge of a circular opening of the substrate, wherein the concentric circle, formed by the alignment mark, has a radius that is smaller than a radius of the circular opening of the substrate, and wherein the mold is a flat plate that has no opening at a position corresponding to the circular opening of the substrate, wherein the alignment mark on the mold does not transfer on the substrate when the mold is pressed onto the substrate, wherein a fine concavo-convex pattern and the alignment marks have different depths and wherein the alignment marks are arc shaped.

2. The pattern forming method according to claim 1, wherein the alignment mark is formed in a symmetrical position about a center of the concentric circle.

3. The pattern forming method according to claim 2, wherein the mold has at least two or more sets of the alignment marks formed in the symmetrical position.

4. The pattern forming method according to claim 1, wherein the alignment mark is formed on a plurality of different surfaces on the mold.

5. A pattern forming method of pressing a mold, in which a fine concavo-convex pattern is formed, against a substrate and thereby transferring the fine concavo-convex pattern to the surface of the substrate, wherein the mold has a plurality of alignment marks for determining a relative positional relation between the substrate and the mold on concentric circles and wherein the plurality of alignment marks comprise a plurality of pairs of alignment marks disposed symmetrically in relation to a center of the concentric circle, wherein the concentric circle, formed by the plurality of pairs of the alignment marks, has a radius that is smaller than a radius of a circular opening of the substrate, wherein the mold is a flat plate that has no opening at a position corresponding to the circular opening of the substrate, wherein the alignment mark on the mold does not transfer on the substrate when the mold is pressed onto the surface, wherein a fine concavo-convex pattern and the alignment marks have different depths and wherein the alignment marks are arc shaped, the method further comprising detecting whether or not any of the plurality of alignment marks has a damage at the time of determining the relative position in accordance with pattern shape, wherein if a damaged alignment mark is detected during the detecting, selecting a pair of undamaged alignment marks among the plurality of pairs of alignment marks, and carrying out an alignment between the mold and the substrate in accordance with relative positional relation between the pair of undamaged alignment marks and the edge of circular opening of the substrate.

6. The pattern forming method according to claim 5, wherein the damaged alignment mark is detected referring to a positional information.

7. The pattern forming method according to claim 5, wherein the damaged alignment mark is detected referring to a pattern shape.

* * * * *